United States Patent
Hinokuma et al.

(10) Patent No.: US 7,151,708 B2
(45) Date of Patent: Dec. 19, 2006

(54) SEMICONDUCTOR INTEGRATED CIRCUIT AND OPERATIONAL AMPLIFIER

(75) Inventors: Yasuhiro Hinokuma, Gunma (JP); Hiroyuki Miyashita, Ashikaga (JP)

(73) Assignee: Sanyo Electric Co., Ltd., Osaka (JP)

( * ) Notice: Subject to any disclaimer, the term of this patent is extended or adjusted under 35 U.S.C. 154(b) by 57 days.

(21) Appl. No.: 11/145,189

(22) Filed: Jun. 6, 2005

(65) Prior Publication Data

US 2005/0281103 A1 Dec. 22, 2005

(30) Foreign Application Priority Data

Jun. 8, 2004 (JP) ............................. 2004-169517

(51) Int. Cl.
*G11C 5/14* (2006.01)
(52) U.S. Cl. ...................... 365/229; 365/226
(58) Field of Classification Search ............... 365/229, 365/226, 207
See application file for complete search history.

(56) References Cited

U.S. PATENT DOCUMENTS 5,189,316 A * 2/1993 Murakami et al. .......... 327/530
5,483,494 A * 1/1996 Taura .................... 365/185.21
6,313,694 B1 * 11/2001 Sohn ......................... 327/541
6,504,784 B1 * 1/2003 Kokubo ..................... 365/229

FOREIGN PATENT DOCUMENTS

JP 10-075133 3/1998

* cited by examiner

Primary Examiner—Anh Phung
(74) Attorney, Agent, or Firm—Morrison & Foerster LLP

(57) ABSTRACT

Deterioration in characteristics of a MOS transistor due to bias instability caused in a stand-by mode is suppressed to prevent deterioration in circuit characteristics. An operational amplifier circuit according to this invention includes MOS transistors for connection that are connected between back gates of differential MOS transistors and their sources and a MOS transistor for biasing that is connected between a power supply potential and the back gates. One of the MOS transistors for connection is a P-channel type MOS transistor having a gate to which a stand-by signal STB is applied. Another of the MOS transistors for connection is an N-channel type MOS transistor having a gate to which the reverse stand-by signal STBB is applied. And the MOS transistor for biasing is a P-channel type MOS transistor having a gate to which the reverse stand-by signal STBB is applied.

16 Claims, 2 Drawing Sheets in normal operation

VB=VS in stand-by mode

VB=VDD

VSS < VB < VDD

SEMICONDUCTOR INTEGRATED CIRCUIT AND OPERATIONAL AMPLIFIER

CROSS-REFERENCE OF THE INVENTION

This invention is based on Japanese Patent Application No. 2004-169517, the content of which is incorporated herein by reference in its entirety.

BACKGROUND OF THE INVENTION

1. Field of the Invention

This invention relates to a semiconductor integrated circuit and an operational amplifier, specifically to a semiconductor integrated circuit and an operational amplifier that can be set into a stand-by mode.

2. Description of the Related Art

Bias instability is one of factors to cause deterioration in characteristics of an MOS transistor. It is a change in the transistor characteristics (mainly a threshold voltage Vt) over time due to trapping of charges into defects in a gate oxide film, when strong electric field is generated in the gate oxide film of the MOS transistor and maintained for a long period or the gate oxide film is placed in a strong electric field by dynamic operation.

There are two modes of bias instability, i.e. NBTI (Negative Bias Temperature Instability) mode and PBTI (Positive Bias Temperature Instability) mode, according to a direction of the electric field in the gate oxide. The direction of the gate electric field is from a back gate toward the gate in the NBTI mode, while the direction of the gate electric field is from the gate toward the back gate in the PBTI mode on the contrary.

Correlation between the instability of the MOS transistor and deterioration of circuit characteristics is explained hereinafter using an example of a concrete circuit. FIG. 3 is a circuit diagram showing an operational amplifier circuit of a prior art. The operational amplifier circuit is provided with a pair of N-channel type MOS transistors M1 and M2 that constitutes a current mirror and a pair of P-channel type differential MOS transistors M3 and M4. Each of a pair of differential input signals VINN and VINP is applied to each gate of the differential MOS transistors M3 an M4, respectively. A P-channel type MOS transistor M5 for biasing, to a gate of which a bias potential VBias is applied, is inserted between the pair of P-channel type differential MOS transistors M3 and M4 and a power supply potential VDD. A back gate bias effect is prevented to set a wide input dynamic range for the operational amplifier circuit by connecting back gates B with sources S of the pair of differential MOS transistors M3 and M4.

M6 and M7 are output MOS transistors. M6 is P-channel type while M7 is N-channel type. An electric potential at a connecting node between the differential MOS transistor M4 and the MOS transistor M2 is supplied to a gate of the output MOS transistor M7. And an N-channel type MOS transistor M8 that is controlled by a stand-by signal STB is connected to the gate of the output transistor M7 so that the MOS transistor M8 is turned on to forcibly set the gate of the output MOS transistor M7 at a ground potential VSS to turn off the output MOS transistor M7 when the stand-by signal STB is turned to "high" in a stand-by mode.

And the bias potential VBias is applied to a gate of the output MOS transistor M6. An N-channel type MOS transistor M9 that is controlled by a reverse stand-by signal STBB is connected to a line providing the gate of the output transistor M6 with the bias potential VBias so that the MOS transistor M9 is turned on to forcibly set the gate of the output MOS transistor M6 at the power supply potential VDD to turn off the output MOS transistor M6 when the reverse stand-by signal STBB is turned to "low" in the stand-by mode. That is, the bias potential VBias is set at an intermediate potential between the power supply potential VDD and the ground potential VSS in normal operation, and is forcibly set at the power supply potential VDD in the stand-by mode by turning-on of the MOS transistor M9.

Therefore, according to this operational amplifier circuit, power consumption of the circuit is reduced by turning-off of the MOS transistor M5 for biasing and the output MOS transistors M6 and M7 in the stand-by mode.

As for the MOS transistor M5 for biasing and the output MOS transistors M6 and M7, the gate electric field in each of them is weak in the stand-by mode, causing no problem due to the bias instability. As for the pair of differential MOS transistors M3 and M4, however, their back gates B are left floating with their back gate potential VB being uncertain, since the MOS transistor M5 for biasing is turned off. Thus, depending on the differential input signals VINN and VINP, their gate electric field becomes strong to cause the two modes of bias instability, i.e. NBTI mode and PBTI mode described above. Further details are found in Japanese Patent Publication No. H10-075133.

Since the back gates B of the pair of differential MOS transistors M3 and M4 are left floating in the stand-by mode in the operational amplifier circuit of FIG. 3, there arise the two modes of bias instability, i.e. NBTI mode and PBTI mode, as described above, causing deterioration in characteristics of the transistors, especially a big change in threshold voltages over time, leading to an offset voltage between the differential MOS transistors in normal operation in some cases.

Which bias instability mode, i.e. NBTI mode or PBTI mode, causes more deterioration in the transistor characteristics depends strongly on manufacturing processes. An experiment conducted by the inventors has proved that a change over time caused in a threshold voltage Vt of a P-channel type MOS transistor prototyped by a certain manufacturing process is larger in the PBTI mode than in the NBTI mode.

In the operational amplifier circuit described above, when the differential input signal VINN to the differential MOS transistor M3 is set at the power supply potential VDD, for example, as shown in FIG. 4, VINN becomes larger than VB since the back gate potential VB is considered to be in a range VSS<VB<VDD and uncertain in the stand-by mode, thus leading to the PBTI mode and causing the change in the threshold voltage Vt over time.

SUMMARY OF THE INVENTION

This invention offers a semiconductor device having a switching circuit that connects a back gate of a MOS transistor to its source in a normal operation and provides the back gate with a predetermined potential that suppresses a change in characteristics of the MOS transistor over time according to an instability characteristics of the MOS transistor in a stand-by mode. The predetermined potential is preferably a power supply potential VDD for a P-channel type MOS transistor to be set in an NBTI mode.

DETAILED DESCRIPTION OF THE INVENTION

Figure 1:
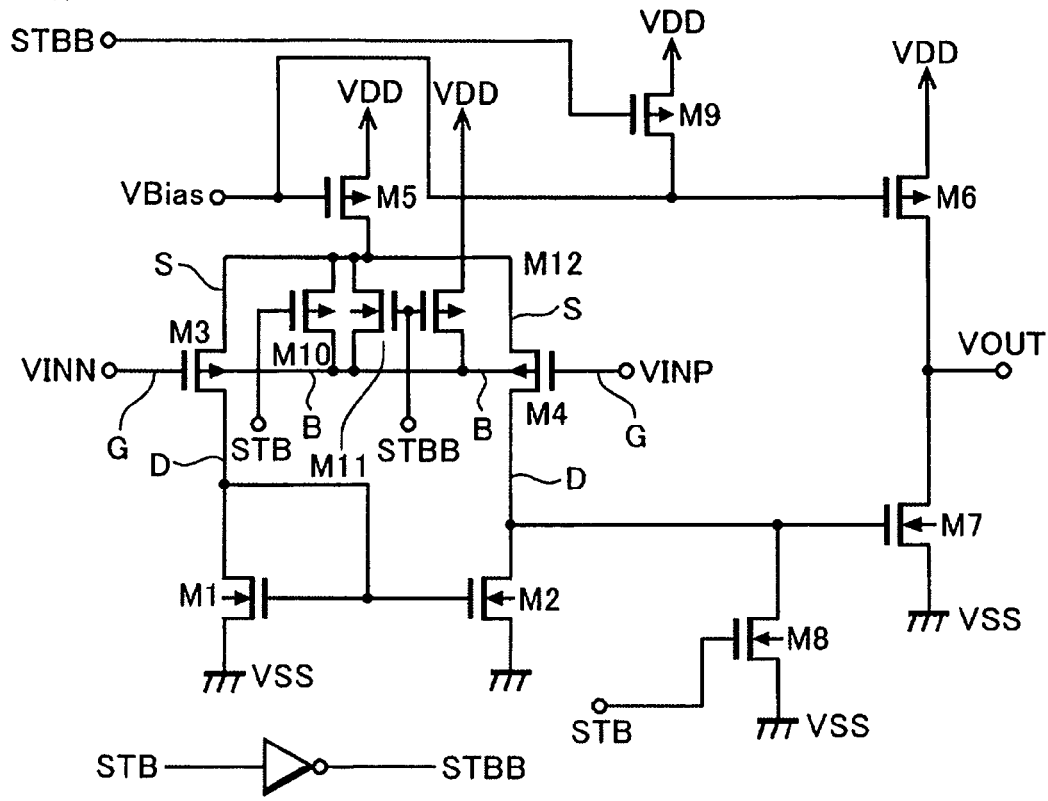
FIG. 1 is a circuit diagram showing an operational amplifier circuit according to an embodiment of this invention.
Figure 3:
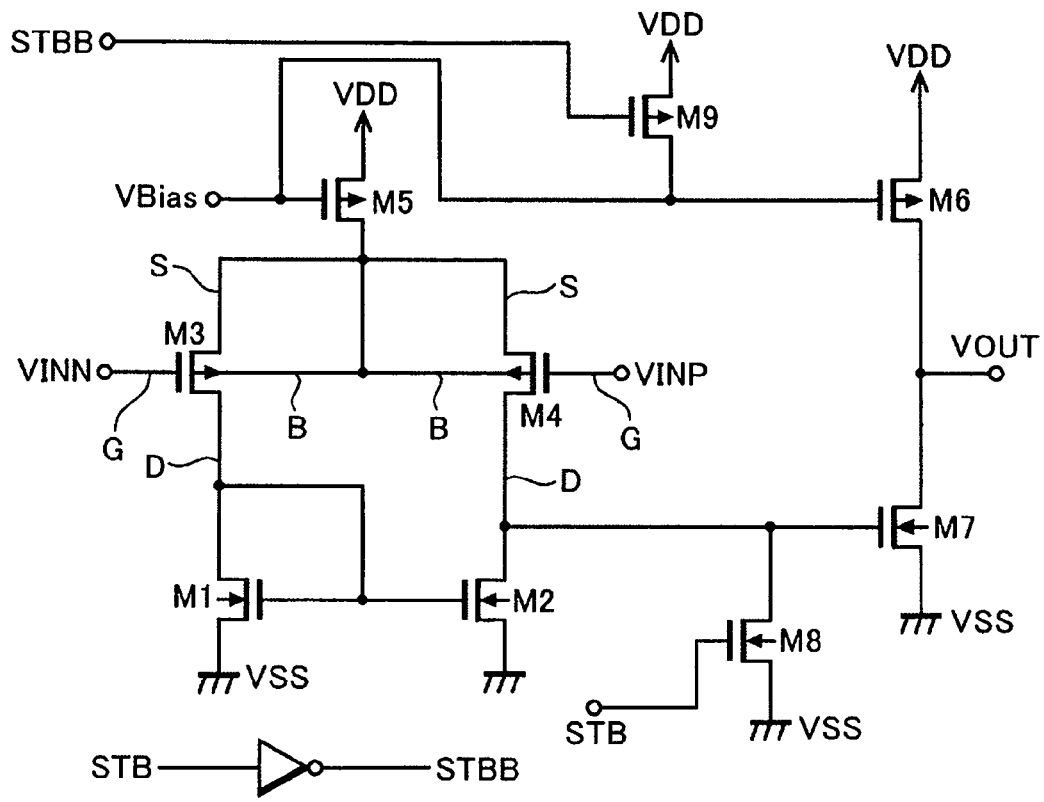
FIG. 3 is a circuit diagram showing an operational amplifier circuit according to a prior art.
Figure 4:
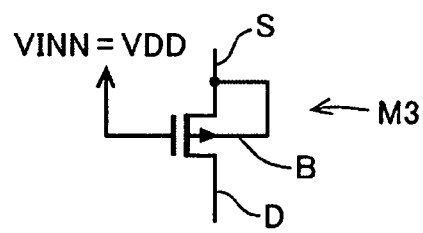
FIG. 4 shows bias conditions of a differential MOS transistor M3 shown in FIG. 3.

Next, an operational amplifier circuit according to an embodiment of this invention will be explained referring to the drawings. As shown in FIG. 1, this operational amplifier circuit includes MOS transistors M10 and M11 for connection that are connected between the back gates B and the sources S of the differential MOS transistors M3 and M4 and a MOS transistor M12 for biasing that is connected between the power supply potential VDD and the back gates B, in addition to the operational amplifier circuit shown in FIG. 3.

M10 is a P-channel type MOS transistor having a gate to which the stand-by signal STB is applied. M11 is an N-channel type MOS transistor having a gate to which the reverse stand-by signal STBB is applied. And M12 is a P-channel type MOS transistor having a gate to which the reverse stand-by signal STBB is applied.

Since the stand-by signal STB is at low level and the reverse stand-by signal STBB is at high level in the normal operation, the MOS transistors M10 and M11 are turned on to connect the back gates B with the sources S. On the other hand, the MOS transistor M12 is turned off. And the P-channel MOS transistor M5 for biasing is turned on to provide the sources of the pair of P-channel type differential MOS transistors M3 and M4 with a constant bias current, since the bias potential VBias supplied to a gate of the p-channel type MOS transistor M5 is set at an intermediate potential between the power supply potential VDD and the ground potential VSS. In normal operation, therefore, the operational amplifier circuit performs the normal operation that is a differential amplification of the pair of differential input signals VINN and VINP applied to the gates of the pair of P-channel type differential MOS transistors M3 and M4.

In the stand-by mode, on the other hand, the MOS transistors M10 and M11 are turned off to disconnect the back gates B from the sources S of the pair of P-channel type differential MOS transistors M3 and M4, since the stand-by signal STB is at the high level and the reverse stand-by signal STBB is at the low level. On the other hand, the MOS transistor M12 is turned on to provide the back gates B with the power supply potential VDD. And the P-channel type MOS transistor M5 for biasing is turned off since the bias potential VBias supplied to the gate of the p-channel type MOS transistor M5 is set at the power supply potential VDD. When the P-channel type MOS transistor M5 is turned off, the supply of the constant bias current to the pair of P-channel type MOS transistors M3 and M4 is stopped to reduce the power consumption of the circuit.

Bias conditions of the differential MOS transistor M3 in the normal operation as well as in the stand-by mode described above will be explained referring to FIGS. 2A and 2B. Explanations below also apply to another differential MOS transistor M4.

Figure 2A:
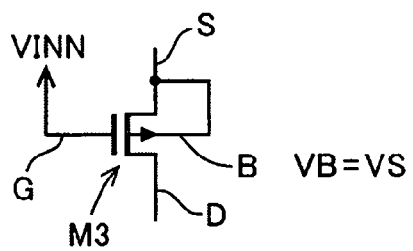
FIGS. 2A and 2B show bias conditions of a differential MOS transistor M3 shown in FIG. 1.
Figure 2B:
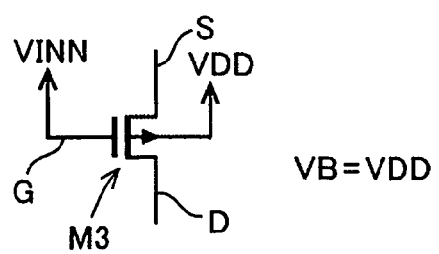

The back gate B and the source S of the P-channel type differential MOS transistor M3 are connected with each other, thus a potential VB at the back gate B and a potential VS at the source S are set equal to each other in the normal operation, as shown in FIG. 2A. In the stand-by mode, on the other hand, although the source S becomes floating, the back gate potential VB is set at the power supply potential VDD, as shown in FIG. 2B.

Therefore, an inequality VINN≦VB (VDD) holds when the differential input signal VINN applied to the gate of the P-channel type MOS differential MOS transistor M3 is within a range between VSS and VDD. Since the bias instability of the P-channel type differential MOS transistor M3 is that of the NBTI mode, the change in the threshold voltage Vt over time is suppressed and thus the deterioration of the circuit characteristics is suppressed. In the case VINN=VB=VDD, although it is not in the NBTI mode in a strict sense, the gate electric field is weak and no change over time occurs in the threshold voltage Vt.

The operational amplifier circuit having the stand-by function is described in the embodiment. However this invention is not limited to the above, and is widely applicable to semiconductor integrated circuits having a MOS transistor, a source of which becomes floating in a stand-by mode, and is equally effective in suppressing deterioration of characteristics of the MOS transistor based on bias instability characteristics.

Also, the embodiment described above is based on the experimental result that the change in the threshold voltage Vt over time is larger in the PBTI mode than in the NBTI mode for a P-channel type MOS transistor. Although there is no experimental result for an N-channel type MOS transistor, it is expected that the change in the threshold voltage Vt over time is larger in the NBTI mode than in the PBTI mode for the N-channel type MOS transistor.

Therefore, it is preferable in that case that the back gates of the N-channel type MOS transistor are set at the ground potential VSS in the stand-by mode. To be more specific, when the operational amplifier circuit in FIG. 1 is an N-channel type operational amplifier having a pair of N-channel type differential MOS transistors, it is preferable to set back gates of the N-channel type differential MOS transistors at the ground potential VSS in order to place the pair of N-channel type differential MOS transistors in the PBTI mode in the stand-by mode.

The deterioration in the characteristics of a MOS transistor due to the bias instability caused in the stand-by mode is suppressed to prevent the deterioration of circuit characteristics according to the semiconductor integrated circuit and the operational amplifier circuit of this invention.

What is claimed is:

1. A semiconductor integrated circuit comprising:
   a first metal oxide silicon transistor;
   a second metal oxide silicon transistor that turns on in a first operation mode to provide the first transistor with a bias current from a first voltage source at a first electric potential and turns off in a second operation mode not to provide the first transistor with the bias current; and
   a switching circuit that in the first operation mode connects a back gate of the first transistor and a source of the first transistor and in the second operation mode disconnects the back gate from the source of the first transistor and connects the back gate and a second voltage source at a second electric potential.

2. The semiconductor integrated circuit of claim 1, wherein the second electric potential is determined based on an effect of conductivity type of the first transistor on bias instability.

3. The semiconductor integrated circuit of claim 1, wherein the switching circuit comprises a first switching device disposed between the back gate and the source of the first transistor and a second switching device disposed between the back gate and the second voltage source.

4. The semiconductor integrated circuit of claim 3, wherein the first switching device and the second switching device are configured to switch on and off according to a stand-by signal.

5. The semiconductor integrated circuit of claim 1, wherein the first electric potential is a power supply potential and the second electric potential is another power supply potential.

6. The semiconductor integrated circuit of claim 1, wherein the first electric potential is equal to the second electric potential.

7. An operational amplifier circuit comprising:
a first metal oxide silicon transistor comprising a back gate;
a second metal oxide silicon transistor comprising a back gate that is connected with the back gate of the first transistor;
a third metal oxide silicon transistor that turns on in a first operation mode to provide the first and second transistors with a bias current from a first voltage source at a first electric potential and turns off in a second operation mode not to provide the first and second transistors with the bias current; and
a switching circuit that in the first operation mode connects the connected back gates and corresponding sources of the first and second transistors and in the second operation mode disconnects the connected back gates from the corresponding sources and connects the connected back gates and a second voltage source at a second electric potential.

8. The semiconductor integrated circuit of claim 7, wherein the second electric potential is determined based on an effect of conductivity type of the first and second transistors on bias instability.

9. The operational amplifier circuit of claim 7, wherein the switching circuit comprises a first switching device disposed between the connected back gates and the corresponding source of the first transistor and a second switching device disposed between the connected back gates and the second voltage source.

10. The operational amplifier circuit of claim 9, wherein the first switching device and the second switching device are configured to switch on and off according to a stand-by signal.

11. The operational amplifier circuit of claim 7, wherein the first electric potential is a power supply potential and the second electric potential is another power supply potential.

12. The semiconductor integrated circuit of claim 7, wherein the first electric potential is equal to the second electric potential.

13. A semiconductor integrated circuit comprising:
a first metal oxide silicon transistor of P-type;
a second metal oxide silicon transistor that turns on in a first operation mode to connect a source of the first transistor and a power supply source providing a power voltage and turns off in a second operation mode to disconnect the source of the first transistor from the power supply source; and
a switching circuit that in the first operation mode connects a back gate of the first transistor and the source of the first transistor and in the second operation mode disconnects the back gate from the source of the first transistor and connects the back gate and the power supply source.

14. The semiconductor integrated circuit of claim 13, wherein a voltage applied to a gate of the first transistor is lower than the power voltage.

15. A semiconductor integrated circuit comprising:
a first metal oxide silicon transistor of N-type;
a second metal oxide silicon transistor that turns on in a first operation mode to connect a source of the first transistor and a ground source providing a reference voltage and turns off in a second operation mode to disconnect the source of the first transistor from the ground source; and
a switching circuit that in the first operation mode connects a back gate of the first transistor and the source of the first transistor and in the second operation mode disconnects the back gate from the source of the first transistor and connects the back gate and the ground source.

16. The semiconductor integrated circuit of claim 15, wherein a voltage applied to a gate of the first transistor is higher than the reference voltage.

* * * * *